(12) United States Patent
Natarajan et al.

(10) Patent No.: US 9,306,103 B2
(45) Date of Patent: Apr. 5, 2016

(54) BACK CONTACT PHOTOVOLTAIC MODULE WITH INTEGRATED CIRCUITRY

(71) Applicant: E I DU PONT DE NEMOURS AND COMPANY, Wilmington, DE (US)

(72) Inventors: Dilip Natarajan, Wilmington, DE (US); Thomas D Lantzer, Wake Forest, NC (US); Charles Anthony Smith, Vienna, WV (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 241 days.

(21) Appl. No.: 13/723,677

(22) Filed: Dec. 21, 2012

(65) Prior Publication Data

US 2013/0160813 A1   Jun. 27, 2013

Related U.S. Application Data

(60) Provisional application No. 61/579,030, filed on Dec. 22, 2011.

(51) Int. Cl.
| | |
|---|---|
| H01L 29/72 | (2006.01) |
| H01L 31/05 | (2014.01) |
| H01L 31/18 | (2006.01) |
| H05K 1/03 | (2006.01) |
| H01L 31/048 | (2014.01) |
| H01L 31/049 | (2014.01) |

(52) U.S. Cl.
CPC .......... *H01L 31/0516* (2013.01); *H01L 31/048* (2013.01); *H01L 31/049* (2014.12); *H01L 31/1876* (2013.01); *H05K 1/03* (2013.01); *Y02E 10/50* (2013.01)

(58) Field of Classification Search
CPC .................... H01L 27/14618; Y02E 10/50
USPC ............................... 438/66; 136/244
See application file for complete search history.

(56) References Cited

U.S. PATENT DOCUMENTS

| | | | |
|---|---|---|---|
| 5,425,832 | A | 6/1995 | Kusano et al. |
| 5,892,558 | A | 4/1999 | Ge et al. |
| 6,538,084 | B2 | 3/2003 | Kitahara et al. |
| 7,153,722 | B2 | 12/2006 | Shimizu |

(Continued)

FOREIGN PATENT DOCUMENTS

| | | |
|---|---|---|
| EP | 1781735 B1 | 12/2008 |
| WO | 2006122376 A1 | 11/2006 |

(Continued)

OTHER PUBLICATIONS

Rees, Richard W., Ionic Bonding in Thermoplastic Resins, DuPont Innovation, 1971, pp. 1-4, vol. 2(2).

(Continued)

*Primary Examiner* — Edward Wojciechowicz

(57) ABSTRACT

A back-contact solar cell module and a process for making such a solar cell module are provided. The module includes a porous wire mounting layer with a plurality of elongated electrically conductive wires mounted thereon. A polymeric encapsulant layer is provided between a rear surface of solar cells of the module and the porous wire mounting layer and is melted to adhere to the solar cells and penetrate the porous wire mounting layer. Back electrical contacts on the solar cells are electrically connected to the electrically conductive wires through the porous wire mounting layer.

11 Claims, 14 Drawing Sheets

(56) References Cited

U.S. PATENT DOCUMENTS

| | | |
|---|---|---|
| 7,432,438 B2 | 10/2008 | Rubin et al. |
| 2007/0289768 A1 | 12/2007 | Moore et al. |
| 2008/0216887 A1 | 9/2008 | Hacke et al. |
| 2008/0314626 A1 | 12/2008 | Moore |
| 2010/0200058 A1* | 8/2010 | Funakoshi .................... 136/256 |
| 2011/0067751 A1* | 3/2011 | Meakin et al. ................. 136/251 |
| 2011/0083726 A1 | 4/2011 | Takayanagi et al. |
| 2013/0327390 A1 | 12/2013 | Borgers et al. |

FOREIGN PATENT DOCUMENTS

| | | |
|---|---|---|
| WO | 2009144715 A2 | 12/2009 |
| WO | 2010027265 A2 | 3/2010 |
| WO | 2010040775 A2 | 4/2010 |
| WO | 2011011091 A2 | 1/2011 |
| WO | 2011011855 A1 | 2/2011 |
| WO | 2011044417 A2 | 4/2011 |

OTHER PUBLICATIONS

Rees, Richard W., Physical Properties and Structural Features of Surlyn Ionomer Resins, Polyelectrolyes, 1976, pp. 177-197.
Rapra Review Reports, Daikin's New FluoroResin Ensures Direct Bonding to Metals, Plastics, Japan Chemical Week, Apr. 10, 2003, pp. 2, vol. 44, No. 2216.
U.S. Appl. No. 13/661,249, filed Oct. 26, 2012.
U.S. Appl. No. 13/661,277, filed Oct. 26, 2012.
U.S. Appl. No. 13/661,319, filed Oct. 26, 2012.
U.S. Appl. No. 13/661,161, filed Oct. 26, 2012.
U.S. Appl. No. 13/723,596, filed Dec. 21, 2012.

* cited by examiner

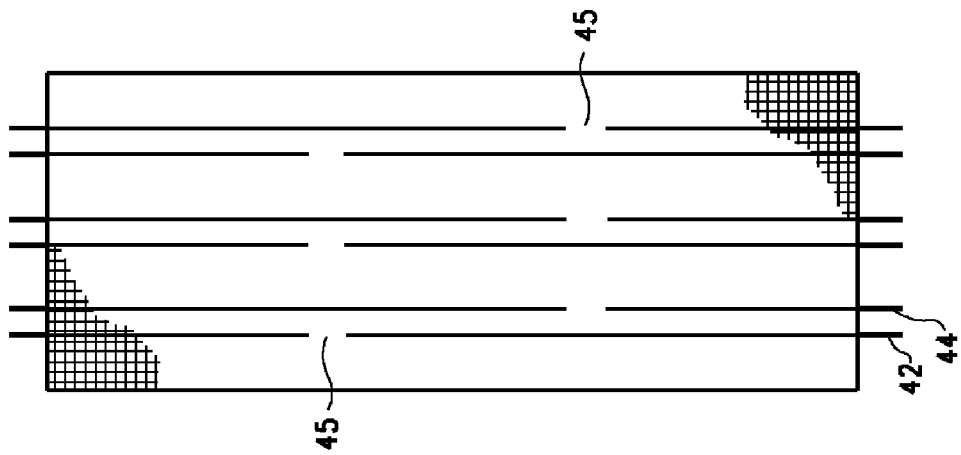
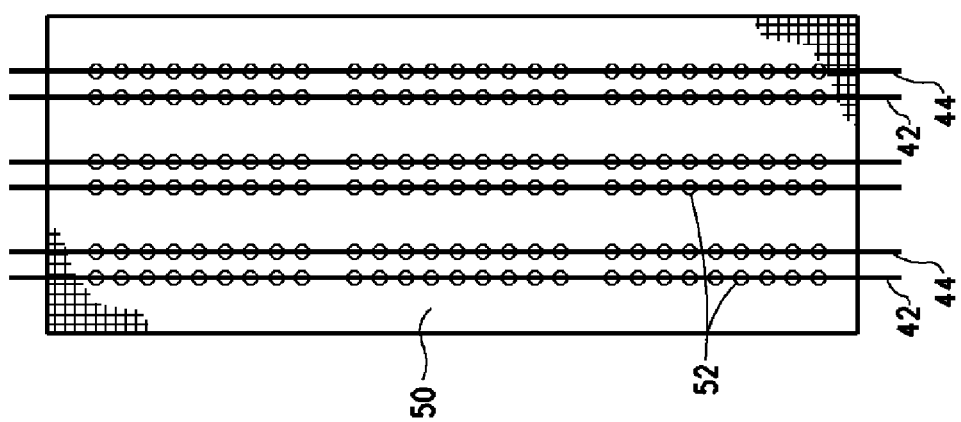

BACK CONTACT PHOTOVOLTAIC MODULE WITH INTEGRATED CIRCUITRY

FIELD OF THE INVENTION

The present invention relates to photovoltaic modules, and more particularly to back-contact photovoltaic modules with electrically conductive circuits integrated into the modules.

BACKGROUND

A photovoltaic cell converts radiant energy, such as sunlight, into electrical energy. In practice, multiple photovoltaic cells are electrically connected together in series or in parallel and are protected within a photovoltaic module or solar module.

As shown in FIG. 1, a photovoltaic module 10 comprises a light-transmitting front sheet substrate 12, a front encapsulant layer 14, an active photovoltaic cell layer 16, a rear encapsulant layer 18 and a back-sheet 20. The light-transmitting front sheet (also know as the incident layer) may be comprised of glass or plastic, such as films or sheets of polycarbonate, acrylic, polyacrylate, cyclic polyolefin, such as ethylene norbornene polymer, polystyrene, polyamide, polyester, silicon polymers and copolymers, fluoropolymers and the like, and combinations thereof. The front and back encapsulant layers 14 and 18 adhere the photovoltaic cell layer 16 to the front and back sheets, they seal and protect the photovoltaic cells from moisture and air, and they protect the photovoltaic cells against physical damage. The encapsulant layers 14 and 18 are typically comprised of thermoplastic or thermosetting polymers such as ethylene-vinyl acetate copolymer (EVA). The photovoltaic cell layer 16 is made up of any type of photovoltaic cell that converts sunlight to electric current such as single crystal silicon solar cells, polycrystalline silicon solar cells, microcrystal silicon solar cells, amorphous silicon-based solar cells, copper indium (gallium) diselenide solar cells, cadmium telluride solar cells, compound semiconductor solar cells, dye sensitized solar cells, and the like. The back-sheet 20 provides structural support for the module 10, it electrically insulates the module, and it helps to protect the module wiring and other components against the elements, including heat, water vapor, oxygen and UV radiation. The module layers need to remain intact and adhered for the service life of the photovoltaic module, which may extend for multiple decades.

Photovoltaic cells typically have electrical contacts on both the front and back sides of the photovoltaic cells. However, contacts on the front sunlight receiving side of the photovoltaic cells can cause up to a 10% shading loss.

In back-contact photovoltaic cells, all of the electrical contacts are moved to the back side of the photovoltaic cell. With both the positive and negative polarity electrical contacts on the back side of the photovoltaic cells, electrical circuitry is needed to provide electrical connections to the positive and negative polarity electrical contacts on the back of the photovoltaic cells. U.S. Patent Application No. 2011/0067751 discloses a back contact photovoltaic module with a back-sheet having patterned electrical circuitry that connects to the back contacts on the photovoltaic cells during lamination of the solar module. The circuitry is formed from a metal foil that is adhesively bonded to a carrier material such as polyester film or Kapton® film. The carrier material may be adhesively bonded to a protective layer such as a Tedlar® fluoropolymer film. The foil is patterned using etching resists that are patterned on the foil by photolithography or by screen printing according to techniques used in the flexible circuitry industry. The back contacts on the photovoltaic cells are adhered to and electrically connected to the foil circuits by adhesive conductive paste. Adhesively bonding metal foil to a carrier material, patterning the metal foil using etching resists that are patterned by photolithography or screen printing, and adhering the carrier material to one or more protective back-sheet layers can be expensive and time consuming.

PCT Publication No. WO2011/011091 discloses a back-contact solar module with a back-sheet with a patterned adhesive layer with a plurality of patterned conducting ribbons placed thereon to interconnect the solar cells of the module. Placing and connecting multiple conducting ribbons between solar cells is time consuming and difficult to do consistently.

There is a need for back-contact photovoltaic modules with securely integrated conductive circuitry and for a more efficient process for producing a back-contact photovoltaic module with integrated conductive circuitry.

SUMMARY

A process for making a back-contact solar cell module is provided. A solar cell array of at least four solar cells is provided in which the solar cells each having a front light receiving surface, an active layer that generates an electric current when the front light receiving surface is exposed to light, and a rear surface opposite the front surface. The rear surface of the solar cells have positive and negative polarity electrical contacts thereon and at least two of the solar cells of the solar cell array arranged in a column.

A porous wire mounting layer having opposite first and second sides and having a lengthwise direction and a crosswise direction perpendicular to the lengthwise direction is provided. The porous wire mounting layer is porous throughout.

A plurality of elongated electrically conductive wires are provided and adhered to the first side of the porous wire mounting layer in the lengthwise direction of the porous wire mounting layer. The plurality of electrically conductive wires do not touch each other upon being adhered to said porous wire mounting layer, and the plurality of electrically conductive wires extend at least the length of at least two of the solar cells in the solar cell array.

A polymeric encapsulant layer is provided between the rear surface of the solar cells and the second side of the porous wire mounting layer. The polymeric encapsulant layer has openings formed therein that are aligned with electrical contacts of the rear surface of the solar cells. Conductive material is provided in the openings of polymeric encapsulant layer and is used to physically and electrically connect the positive and negative polarity electrical contacts on the rear surface of said solar cells to the electrically conductive wires on the porous wire mounting layer through said encapsulant layer and the porous wire mounting layer. The polymeric encapsulant layer is melted and forced into pores of the porous wire mounting layer and the solidified so as to adhere the encapsulant to the rear surface of the solar cells and to the wire mounting layer. A back-sheet is provided and adhered over the plurality of electrically conductive wires and over the polymeric wire mounting layer.

A back contact solar cell module is also provided. The module comprises a solar cell array of at least four solar cells each having a front light receiving surface, an active layer that generates an electric current when said front light receiving surface is exposed to light, and a rear surface opposite said front surface, where the rear surfaces of the solar cells have positive and negative polarity electrical contacts thereon, and where at least two of the solar cells of the solar cell array arranged in a column. The module includes a porous wire mounting layer having opposite first and second sides and having a lengthwise direction and a crosswise direction perpendicular to the lengthwise direction, where the porous wire mounting layer is porous throughout the wire mounting layer.

Elongated electrically conductive wires are adhered to the first side of the porous wire mounting layer in the lengthwise direction of the porous wire mounting layer. The electrically conductive wires do not touch each other and the wires extend at least the length of at least two of the solar cells in a column of the solar cell array.

A polymeric encapsulant layer is disposed between the rear surface of the solar cells and the second side of the wire mounting layer. The polymeric encapsulant layer has openings formed therein that are aligned with an electrical contact of the rear

BRIEF DESCRIPTION OF THE DRAWINGS

The detailed description will refer to the following drawings which are not drawn to scale and wherein like numerals refer to like elements:

FIGS. 4a and 4b are schematic plan views of a wire mounting layer with adhered conductive wires.

DETAILED DESCRIPTION OF THE INVENTION

Figure 1:
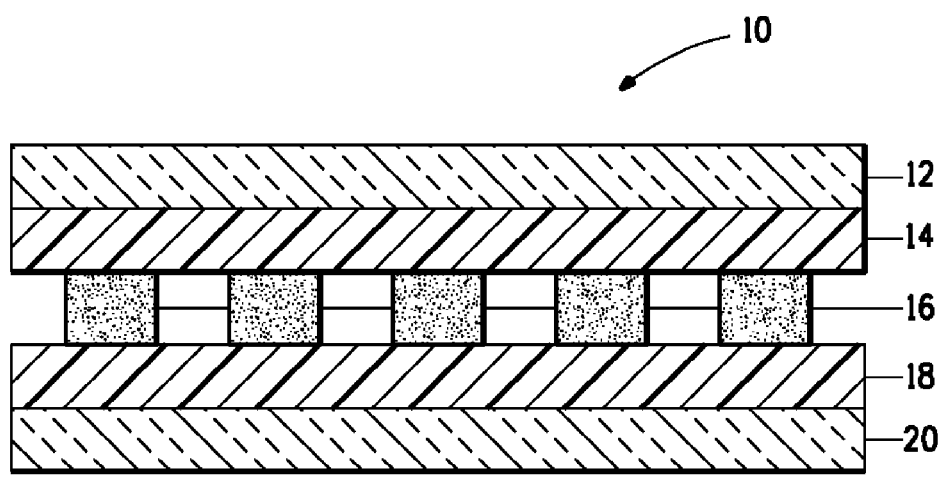
FIG. 1 is cross-sectional view of a conventional solar cell module.

To the extent permitted by the United States law, all publications, patent applications, patents, and other references mentioned herein are incorporated by reference in their entirety.

The materials, methods, and examples herein are illustrative only and the scope of the present invention should be judged only by the claims.

DEFINITIONS

The following definitions are used herein to further define and describe the disclosure.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Unless stated otherwise, all percentages, parts, ratios, etc., are by weight.

When the term "about" is used in describing a value or an end-point of a range, the disclosure should be understood to include the specific value or end-point referred to.

As used herein, the terms "sheet", "layer" and "film" are used in their broad sense interchangeably. A "front sheet" is a sheet, layer or film on the side of a photovoltaic module that faces a light source and may also be described as an incident layer. Because of its location, it is generally desirable that the front sheet has high transparency to the incident light. A "back-sheet" is a sheet, layer or film on the side of a photovoltaic module that faces away from a light source, and is generally opaque. In some instances, it may be desirable to receive light from both sides of a device (e.g., a bifacial device), in which case a module may have transparent layers on both sides of the device.

As used herein, "encapsulant" layers are used to encase the fragile voltage-generating photoactive layer, to protect it from environmental or physical damage, and hold it in place in the photovoltaic module. Encapsulant layers may be positioned between the solar cell layer and the front incident layer, between the solar cell layer and the back-sheet, or both. Suitable polymer materials for the encapsulant layers typically possess a combination of characteristics such as high transparency, high impact resistance, high penetration resistance, high moisture resistance, good ultraviolet (UV) light resistance, good long term thermal stability, good long term weatherability, and adequate adhesion strength to frontsheets, back-sheets, other rigid polymeric sheets and solar cell surfaces.

As used herein, the terms "photoactive" and "photovoltaic" may be used interchangeably and refer to the property of converting radiant energy (e.g., light) into electric energy.

As used herein, the terms "photovoltaic cell" or "photoactive cell" or "solar cell" mean an electronic device that converts radiant energy (e.g., light) into an electrical signal. A photovoltaic cell includes a photoactive material layer that may be an organic or inorganic semiconductor material that is capable of absorbing radiant energy and converting it into electrical energy. The terms "photovoltaic cell" or "photoactive cell" or "solar cell" are used herein to include photovoltaic cells with any types of photoactive layers including, crystalline silicon, polycrystalline silicon, microcrystalline silicon, and amorphous silicon-based solar cells, copper indium (gallium) diselenide solar cells, cadmium telluride solar cells, compound semiconductor solar cells, dye sensitized solar cells, and the like.

As used herein, the term "back-contact solar cell" means a solar cell having both positive and negative polarity contacts located on its back side, including metal wrap through (MWT), metal wrap around (MWA), emitter wrap through (EWT), emitter wrap around (EWA), and interdigitated back contact (IBC) solar cells.

As used herein, the term "photovoltaic module" or "solar module" (also "module" for short) means an electronic device having at least one photovoltaic cell protected on one side by a light transmitting front sheet and protected on the opposite side by an electrically insulating protective back-sheet.

Disclosed herein are back-contact solar modules with integrated conductive wire circuitry and processes for forming such back-contact solar modules with integrated circuitry.

Figure 2B:
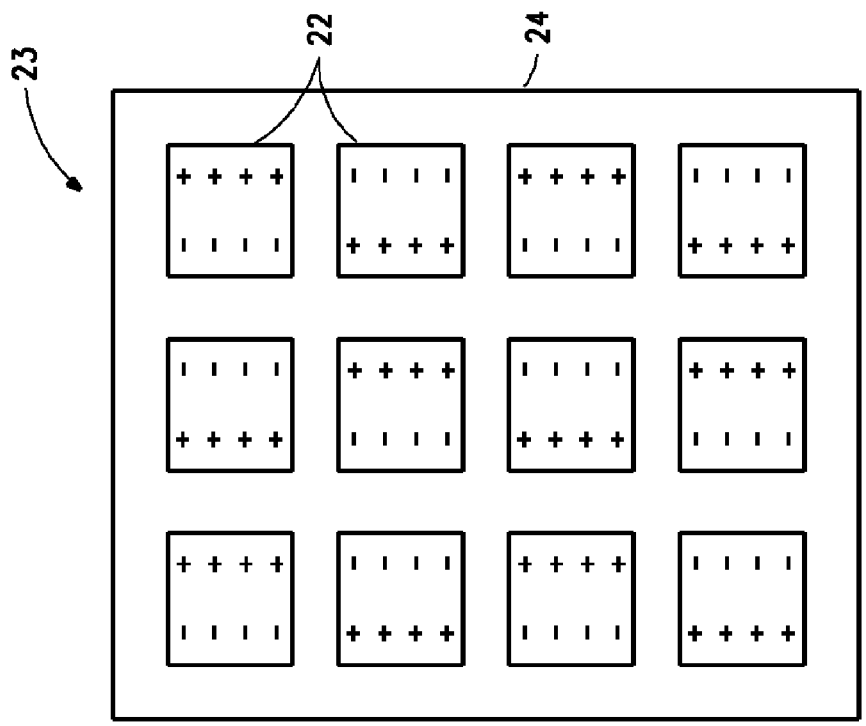
FIGS. 2a and 2b are schematic plan views of the back side of arrays of back-contact solar cells.
Figure 2A:
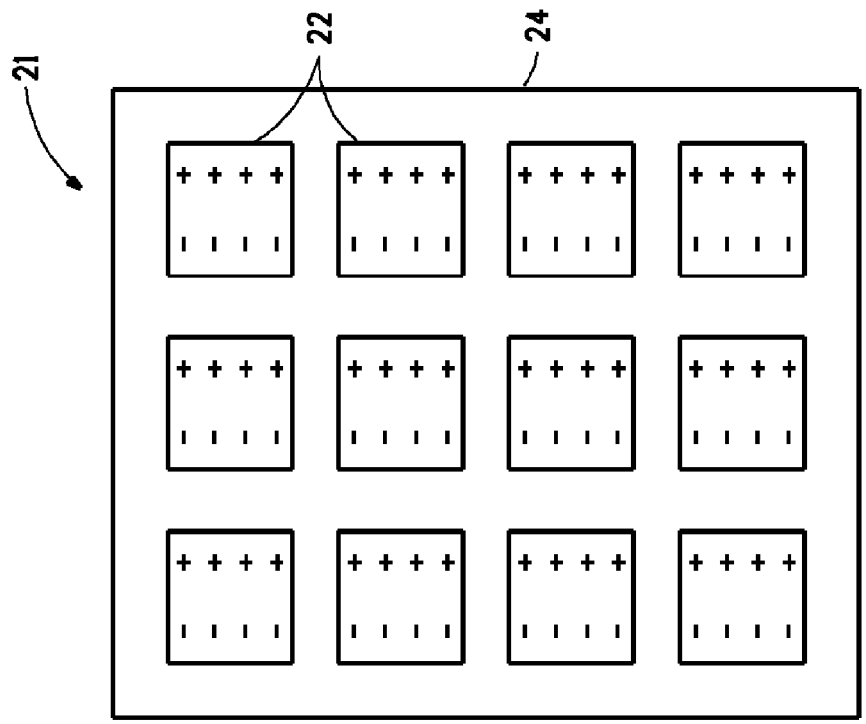

Arrays of back-contact solar cells are shown in FIGS. 2a and 2b. The disclosed integrated structures are useful for protecting and electrically connecting back-contact solar cell arrays like those shown in FIGS. 2a and 2b as well as with arrays of other types of back-contact solar cells. The solar cell array 21 of FIG. 2a includes multiple solar cells 22, such as single crystal silicon solar cells. The front side (not shown) of each solar cell 22 is adhered to an encapsulant layer 24 that is or will be preferably adhered to a transparent front sheet (not shown) of the solar module. Solar modules with an array of twelve solar cells 22 are shown in FIGS. 2a and 2b, but the disclosed integrated back-sheet is useful as a back-sheet for back-contact solar modules having solar cell arrays of anywhere from four to more than 100 solar cells.

Each of the solar cells 22 has multiple positive and negative polarity contacts on back side of the solar cell. The contacts on the back side of the solar cells are typically made of a metal to which electric contacts can be readily formed, such as silver or platinum contact pads. The contacts are typically formed from a conductive paste comprising an organic medium, glass frit and silver particles, and optionally inorganic additives, which is fired at high temperature to form metal contact pads. The solar cell has all of its electrical contacts on the back side of the solar cell. The best known types of back-contact solar cells are metal wrap through (MWT), metal wrap around (MWA), emitter wrap through (EWT), emitter wrap around (EWA), and interdigitated back contact (IBC). Electrical conductors on the light receiving front side of the solar cell (facing the transparent front sheet) are connected through vias in the solar cell to back side conductive pads, while a back side conductive layer is electrically connected to back side contact pads.

The solar cells shown in FIGS. 2a and 2b each have a column of four negative contacts and a column of four positive contacts, but it is contemplated that the solar cells could have multiple columns of negative and positive contacts and that each column could have anywhere form two to more than twenty contacts. In the solar cell array shown in FIG. 2a, the contacts of each cell are arranged in the same way. The arrangement shown in FIG. 2a is used when the cells are electrically connected in parallel. Alternatively, the solar cells in each column of the array can be arranged such that the alternating cells in each column are rotated 180 degrees as shown in FIG. 2b. The solar cell array 23 shown in FIG. 2b is used when the solar cells are electrically connected in series, as will be described more fully below.

A porous wire mounting layer is provided for supporting metal wires that will be physically and electrically connected to the back side electrical contacts of the back contact solar cell array. As shown in FIG. 3a, the wire mounting layer 50 may be made of an open mesh or weave of non-conductive material such as a glass, polymer or reinforced polymer. For example, the wire mounting layer may comprise a porous polymeric nonwoven sheet or mesh. Alternatively, the wire mounting layer may be made of a polymer sheet that is either formed with small holes passing though the sheet or a sheet into which holes are cut or punched. As used herein, "porous wire mounting layer" means a layer that is intrinsically porous or perforated to a degree sufficient for a molten encapsulant layer to penetrate the layer. Where a sheet with holes is used in the wire mounting layer, holes with a diameter of 0.1 mm to 3 cm, and more preferably from about 1 mm to 10 mm, are formed over much or all of the surface of the wire mounting layer, but at a density that is not so great as to substantially reduce the strength and integrity of the wire mounting layer. Preferably, the wire mounting layer has an open area of from 1% to 80%, and more preferably of from about 10% to 75% of the surface of the wire mounting layer. A porosity of from 0.2 to 0.8 is desirable in the wire mounting layer. The wire mounting layer must be sufficiently open such that a melted polymer encapsulant material can penetrate into the wire mounting layer and may even pass through the wire mounting layer during the lamination of a photovoltaic module.

The wire mounting layer 50 preferably has a thickness sufficient to be self-supporting and sufficient to support wires mounted on the wire mounting layer. The wire mounting layer should have a sufficient stiffness such that the spatial relationship and orientation of wires mounted on the wire mounting layer remains fixed throughout the photovoltaic module assembly and lamination process. The wire mounting layer preferably has a thickness in the range of about 1 mils to 25 mils, and more preferably in the range of about 3 mils to 7 mils. The wire mounting layer can include more than one layer of material, wherein each layer includes the same material or a material different from the other layer(s).

The material of which the porous wire mounting layer sheet or mesh is comprised must be electrically insulating and it must have a melting temperature that is higher than the lamination temperature used in the production of the photovoltaic module which is typically in the range of 120° C. to 180° C. Preferably, the wire mounting layer has electrical resistivity like that of electrical insulators, as for example, in the range of $1 \times 10^{11}$ ohm·cm to $1 \times 10^{16}$ ohm·cm. Preferably, the wire mounting layer has a melting temperature that is at least 20° C. above the temperature at which the utilized encapsulant flows so as to avoid deformation of the wire mounting layer. For example, a wire mounting layer with a melting temperature of greater than 100° C. or even a melting temperature greater than 180° C. may be desirable depending on the encapsulant utilized and the module lamination temperature applied.

The wire mounting layer may be comprised of an inorganic material such as an open fiber glass mesh. The wire mounting layer may also be comprised of polymer with a melting temperature of at least 100° C., and more preferably at least 150° C., and even more preferably at least 180° C. Examples of polymers that may be used to form the porous sheet or mesh of the wire mounting layer include polyester, polyolefins, fluoropolymers, and cured encapsulant materials such as thermoplastic or thermoset polymers. The cured encapsulants may include ethylene methacrylic acid and ethylene acrylic acid polymers, ionomers derived therefrom, or combinations thereof. Exemplary comonomers in the precursor acid copolymers include, but are not limited to, methyl acrylates, methyl methacrylates, butyl acrylates, butyl methacrylates, glycidyl methacrylates, vinyl acetates, and mixtures of two or more thereof. As used herein, the term "ionomer" means and denotes a thermoplastic resin containing both covalent and ionic bonds derived from ethylene/acrylic or methacrylic acid copolymers. Preferred polymers for use in the wire mounting layer include cured ethylene vinyl acetate (EVA), poly(vinyl acetals) (including acoustic grade poly(vinyl acetals)), polyurethanes, polyvinylchlorides, polyethylenes, polyolefin block elastomers, ethylene acrylate ester copolymers, silicone elastomers, polycarbonate resins, epoxy resins, nylon resins and combinations of two or more thereof.

Polymer wire mounting layer material may further contain additives, fillers or reinforcing agents known within the art. Exemplary additives include, but are not limited to, plasticizers, processing aides, flow enhancing additives, lubricants, pigments, titanium dioxide, calcium carbonate, dyes, flame retardants, impact modifiers, nucleating agents to increase crystallinity, antiblocking agents such as silica, thermal stabilizers, hindered amine light stabilizers (HALS), UV absorbers, UV stabilizers, anti-hydrolytic agents, dispersants, surfactants, chelating agents, coupling agents, adhesives, primers, reinforcement additives, such as glass fiber, and the like. There are no specific restrictions to the content of the additives, fillers or reinforcing agents in the wire mounting layer as long as they do not produce an adverse impact on the adhesion, electrical insulation, strength or stability properties of the layer.

In order to adhere conductive wires to the wire mounting layer, the wire mounting layer may be comprised of polymer with adhesive properties, or an adhesive coating can be applied to the surface(s) of the wire mounting layer. Pressure sensitive adhesive may be used on the wire mounting layer to adhere conductive wires to the wire mounting layer. Other suitable adhesives include polyurathane, epoxy, and ethylene copolymer adhesives.

Figure 3B:
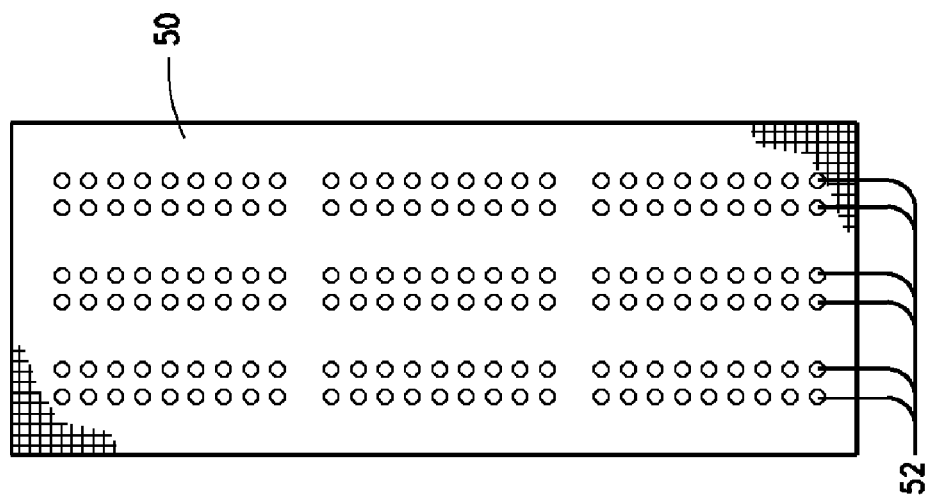
FIGS. 3a and 3b are schematic plan views of a wire mounting layer of a photovoltaic module.
Figure 3A:
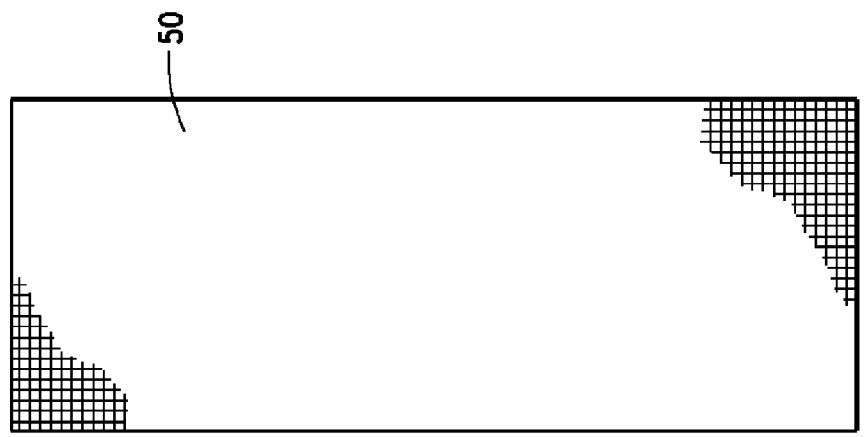

Depending on the openness of the wire mounting layer, it may be desirable to cut or punch holes in the wire mounting layer as shown in FIG. 3b. The wire mounting layer 50 of FIG. 3a may have holes formed in it under where wires are to be mounted on the wire mounting layer and at points that will be over the solar cell back contacts when the wire mounting layer is positioned over the back contacts of the solar cell array. Such holes may be formed, for example, by stamping or die cutting. A polymeric mesh wire mounting layer 50 with additional holes 52 is shown in FIG. 3b.

In the embodiment shown in FIG. 4a, pairs of wires 42 and 44 are adhered to the surface or partially embedded in the wire mounting layer. Where the wire mounting layer has extra hole 52 formed or cut into it, the wires are positioned over the holes such that the solar cell back contacts may be adhered to the wires through the holes in the wire mounting layer as more fully described below with regard to FIGS. 6a-6g.

Substantially parallel pairs of electrically conductive wires 42 and 44 are shown on the wire mounting layer. Three pairs of wires 42 and 44 are shown in FIG. 4a, but it is contemplated that more or fewer pairs of wires could be used depending upon the number of columns of solar cells in the solar cell array, and depending on the number of columns of back contacts on each of the solar cells. It is also contemplated that the spacing of the wires and the wire pairs will depend upon the spacing of the columns of solar cells in the array, and on the arrangement and spacing of the columns of back contacts on each of the solar cells. The wire mounting layer is in the form of an elongated strip that covers at least one column of solar cells in the solar cell array, and preferably covers multiple columns of solar cells in the solar cell array, or may cover all of the columns of solar cells in the solar cell array.

The wires 42 and 44 are preferably conductive metal wires. The metal wires are preferably comprised of metal selected from copper, nickel, tin, silver, aluminum, indium, lead, and combinations thereof. In one embodiment, the metal wires are coated with tin, nickel or a solder and/or flux material. Where the wires are coated with a solder and optionally with a flux, the wires can more easily be soldered to the back contacts of the solar cells. For example, aluminium wires may be coated with an aluminum/silver alloy that can be easily soldered using conventional methods. Where the wires are coated with solder, such as an alloy, the solder may be coated on the wires along their full length or only on the portions of the wires that will come into contact with the solar cell back contacts in order to reduce the amount of the coating material used. The conductive wires may be coated with an electrically insulating material such as a plastic sheath so as to help prevent short circuits in the solar cells when the wires are positioned over the back of an array of solar cells. Were the conductive wires are coated with an insulating material, the insulating material can be formed with breaks where the wires are exposed to facilitate the electrical connection of the wires to the back contacts of the solar cells. Alternatively, the insulating material may be selected such that it will melt or burn off when the wires are soldered or welded to the back contacts on the solar cells. Preferably, the electrically conductive wires each have a cross sectional area of at least 70 square mils along their length, and more preferably have a cross sectional area of at least 200 square mils along their length, and more preferably have a cross sectional area of 500 to 1200 square mils along their length. This wire cross section provides the strength, current carrying ability, low bulk resistivity, and wire handling properties desired for module efficiency and manufacturability. The electrically conductive wires may have any cross sectional shape, but ribbon shaped wires or tabbing wires having a width and thickness where the wire width is at least three times greater than the wire thickness, and more preferably where the wire width is 3 to 15 times the wire thickness, have been found to be especially well suited for electrically connecting to the back contacts of an array of back-contact solar cells.

The wire mounting layer 50 should be long enough to cover multiple solar cells, and is preferably long enough to cover all of the solar cells in a column of solar cells in the solar cell array, and may even be long enough to cover columns of solar cells in multiple solar cell arrays, as for example where the wires are applied to a long strip of the wire mounting layer in a continuous roll-to-roll process. For example, the wire mounting layer and the electrically conductive wires can be continuously fed into a heated nip where the wires are brought into contact with and adhered to the wire mounting layer by heating the wires and/or the wire mounting layer at the nip so as to make the wire mounting layer tacky. Alternatively, the wires and the wire mounting layer can be heated and pressed in a batch lamination press to partially or fully embed the wires into the wire mounting layer. Pressure may be applied to the wires at the heated nip so as to partially or fully embed the conductive wires in the wire mounting layer.

Where the wires on the wire mounting layer connect like mounted solar cells like those shown in FIG. 2a, each set of wires 42 and 44 connect to negative and positive contacts, respectively, of a column of solar cell contacts so as to electrically connect the column of cells in parallel. Where the integrated back-sheet is used to connect solar cells in series, every other cell in a column of cells can be rotated 180 degrees as shown in FIG. 2b and the wires 42 and 44 can be selectively cut at the locations 45 as shown in FIG. 4b to connect adjacent cells in series in a column of solar cells as more fully described below with regard to FIGS. 7a-7f. Cutting the wires can be performed by a variety of methods including mechanical die cutting, rotary die cutting, mechanical drilling, or laser ablation. The wires or the wires along with the underlying wire mounting layer may also be punched out at selected locations.

An encapsulant layer may be provided between the back side of the back contact solar cell layer and the wire mounting layer. Encapsulant layers are used to encase the fragile voltage-generating solar cell layer so as to protect it from environmental or physical damage and hold it in place in the photovoltaic module. Suitable polymer materials for the encapsulant layers typically possess a combination of characteristics such as high impact resistance, high penetration resistance, high moisture resistance, good ultraviolet (UV) light resistance, good long term thermal stability, adequate adhesion strength to front sheets, back-sheets, other rigid polymeric sheets and cell surfaces, and good long term weatherability.

Figure 5:
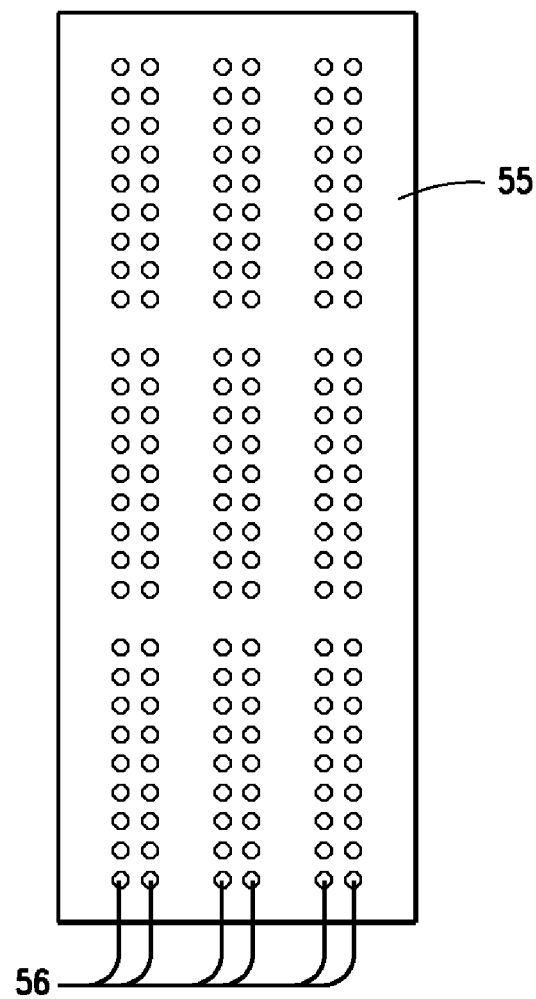
FIG. 5 is a plan view of a an encapsulant layer in which holes or openings have been formed or cut out.

An encapsulant layer is shown in FIG. 5. The sheet 55 is preferably formed with holes, openings or vias 56 that can be aligned over the back contacts of rows of solar cells. The back contacts of one or more columns of solar cell can be physically and electrically connected to the wires on the wire mounting layer through the openings in the encapsulant layer and through the open mesh of the wire mounting layer or through the holes cut into the wire mounting layer.

Encapsulant materials may include ethylene methacrylic acid and ethylene acrylic acid, ionomers derived therefrom, or combinations thereof. Encapsulant materials may also be films or sheets comprising poly(vinyl butyral)(PVB), ionomers, ethylene vinyl acetate (EVA), poly(vinyl acetal), polyurethane (PU), linear low density polyethylene, polyolefin block elastomers, and ethylene acrylate ester copolymers, such as poly(ethylene-co-methyl acrylate) and poly(ethylene-co-butyl acrylate). As used herein, the term "ionomer" means and denotes a thermoplastic resin containing both covalent and ionic bonds derived from ethylene/acrylic or methacrylic acid copolymers. In some embodiments, monomers formed by partial neutralization of ethylene-methacrylic acid copolymers or ethylene-acrylic acid copolymers with inorganic bases having cations of elements from Groups I, II, or III of the Periodic table, notably, sodium, zinc, aluminum, lithium, magnesium, and barium may be used. The term ionomer and the resins identified thereby are well known in the art, as evidenced by Richard W. Rees, "Ionic Bonding In Thermoplastic Resins", DuPont Innovation, 1971, 2(2), pp. 1-4, and Richard W. Rees, "Physical 30 Properties And Structural Features Of Surlyn Ionomer Resins", Polyelectrolytes, 1976, C, 177-197. Other suitable ionomers are further described in European patent EP1781735, which is herein incorporated by reference.

Preferred ethylene copolymers for use for adhesive and encapsulant layers are more fully disclosed in PCT Patent Publication No. WO2011/044417 which is hereby incorporated by reference. Such ethylene copolymers are comprised of ethylene and one or more monomers selected from the group of consisting of C1-4 alkyl acrylates, C1-4 alkyl methacrylates, methacrylic acid, acrylic acid, glycidyl methacrylate, maleic anhydride and copolymerized units of ethylene and a comonomer selected from the group consisting of C4-C8 unsaturated anhydrides, monoesters of C4-C8 unsaturated acids having at least two carboxylic acid groups, diesters of C4-C8 unsaturated acids having at least two carboxylic acid groups and mixtures of such copolymers, wherein the ethylene content in the ethylene copolymer preferably accounts for 60-90% by weight. A preferred ethylene copolymer adhesive layer includes a copolymer of ethylene and another α-olefin. The ethylene content in the copolymer accounts for 60-90% by weight, and more preferably accounts for 65-88% by weight, and ideally accounts for 70-85% by weight of the ethylene copolymer. The other comonomer(s) preferably constitute 10-40% by weight, preferably accounting for 12-35% by weight, and ideally accounting for 15-30% by weight of the ethylene copolymer. The ethylene copolymer adhesive layer is preferably comprised of at least 70 weight percent of the ethylene copolymer. The ethylene copolymer may be blended with up to 30% by weight, based on the weight of the adhesive layer, of other thermoplastic polymers such as polyolefins, as for example linear low density polyethylene, in order to obtain desired properties. Ethylene copolymers are commercially available, and may, for example, be obtained from DuPont under the trade-name Bynel®.

The encapsulant layers may further contain additives, fillers or reinforcing agents known within the art. Such additives include, but are not limited to, plasticizers, processing aides, flow enhancing additives, lubricants, pigments, titanium dioxide, calcium carbonate, dyes, flame retardants, impact modifiers, nucleating agents to increase crystallinity, anti-blocking agents such as silica, thermal stabilizers, hindered amine light stabilizers (HALS), UV absorbers, UV stabilizers, anti-hydrolytic agents, dispersants, surfactants, chelating agents, coupling agents, adhesives, primers, reinforcement additives, such as glass fiber, and the like. There are no specific restrictions on the content of the additives, fillers or reinforcing agents the encapsulant layers as long as they do not produce an adverse impact on the adhesion properties or stability of the layer.

Figure 6A:
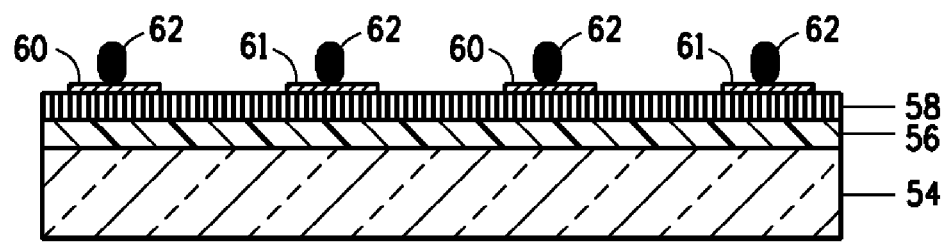
FIGS. 6a-6g are cross-sectional views illustrating one disclosed process for forming a back-contact solar cell module in which integrated conductive wires are connected to the back contacts of solar cells.

FIGS. 6a-6g illustrate in cross section the steps of one process for making a back-contact solar module with integrated wire circuitry. As shown in FIG. 6a, a transparent front sheet 54, made of glass or a polymer such as a durable fluoropolymer, is provided. The transparent front sheet typically has a thickness of from 2 to 4 mm for glass front sheet or 50 to 250 microns for polymer front sheet. A front encapsulant layer 56, as described above, is applied over the front sheet 54. The front encapsulant layer typically has a thickness of from 200 to 500 microns. A photoactive solar cell 58, such as a crystalline silicon solar cell, is provided on the encapsulant layer 56. The solar cell has all of its electrical contacts on the back side of the solar cell. Electrical conductors on the light receiving front side of the solar cell (facing the transparent front sheet) are connected through vias (not shown) in the solar cell to back side conductive pads 60, while a back side conductive layer (not shown) is electrically connected to back side contact pads 61. The back contact pads are typically silver pads fired on the solar cells from a conductive paste of silver particles and glass frit in an organic carrier medium.

A small portion of solder or of a polymeric electrically conductive adhesive is provided on each of the contact pads 60 and 61. The portions of solder or conductive adhesive are shown as balls 62 in FIG. 6a. The solder may be a conventional solder, such as 60/40 tin lead, 60/38/2 tin lead silver, other known solder alloys, or a low melting point solder, such as low melting point solder containing indium that melts around 160° C. or less. The conductive adhesive may be any known conductive adhesive, such as an adhesive comprised of conductive metal particles, such as silver, nickel, conductive metal coated particles or conductive carbon suspended in epoxies, acrylics, vinyl butryals, silicones or polyurathanes. Preferred conductive adhesives are aniostropically conductive or z-axis conductive adhesives that are commonly used for electronic interconnections.

Figure 6B:
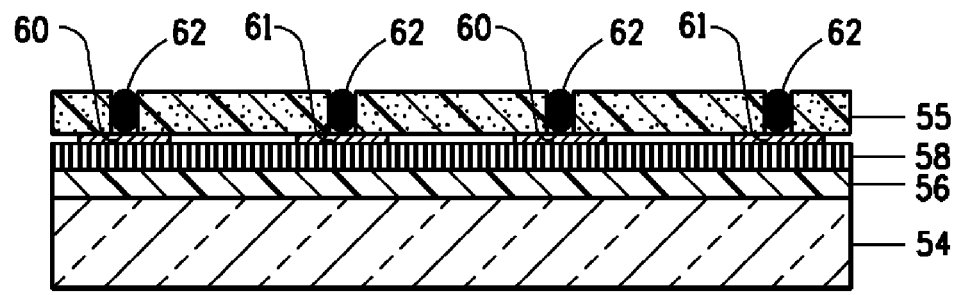

FIG. 6b shows the application of an encapsulant layer 55, like the layer shown and described with regard to FIG. 5, over the back of the solar cell array. In one embodiment, the solder or conductive adhesive is applied or printed in the holes of the encapsulant layer after the encapsulant layer has been placed over the back of the solar cell.

Figure 6C:
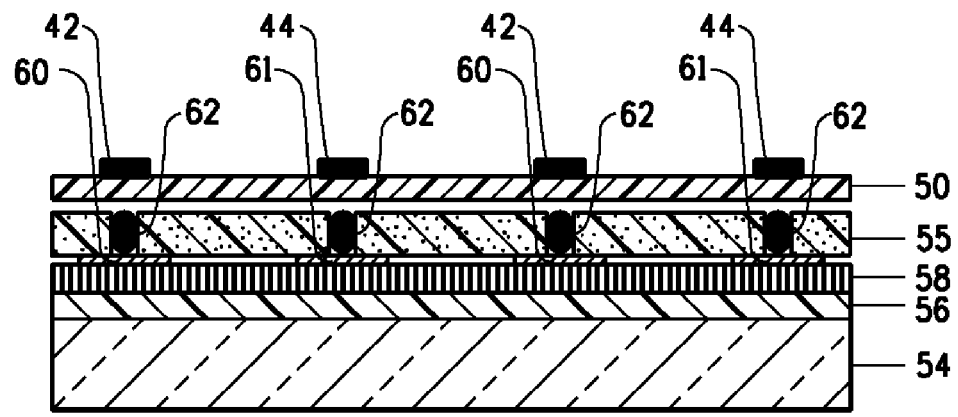

FIG. 6c shows the application of a wire mounting layer 50 over the encapsulant layer 55. Electrically conductive ribbon-shaped wires 42 and 44 are adhered to the porous wire mounting layer and are positioned over the back contacts 60 and 61 of the solar cell 58. The conductive wires 42 and 44 are provided on the wire mounting layer 50 as described above. The porous wire mounting layer 50 shown in FIG. 6c is an open mesh or weave without additional holes formed therein, but additional holes may be formed, cut or punched in the wire mounting layer under the areas where the conductive wires are to be connected to the back contacts of the solar cell to facilitate electrical connection between the wires 43 and 44 and the solar cell back contacts.

Figure 6D:
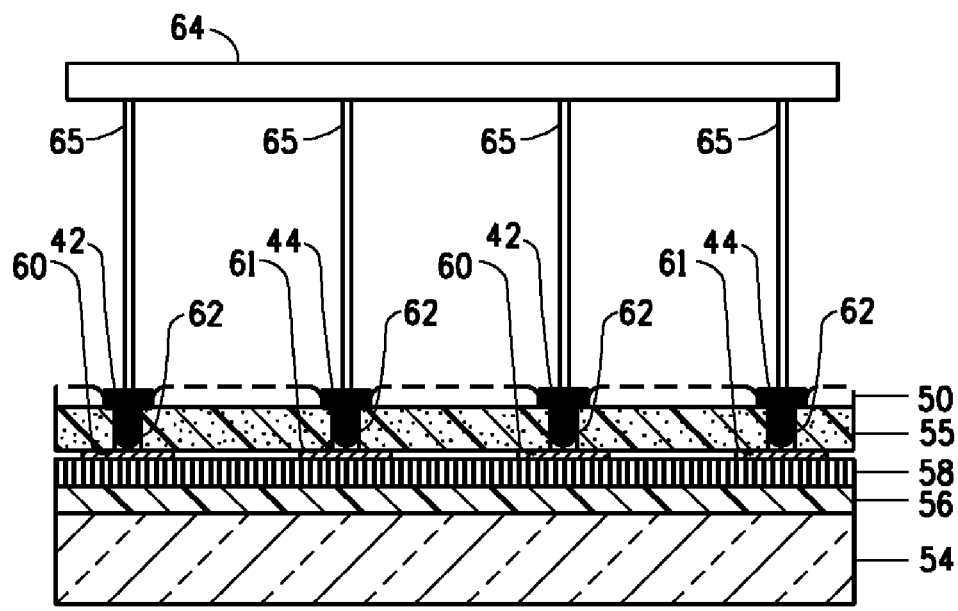
Figure 6E:
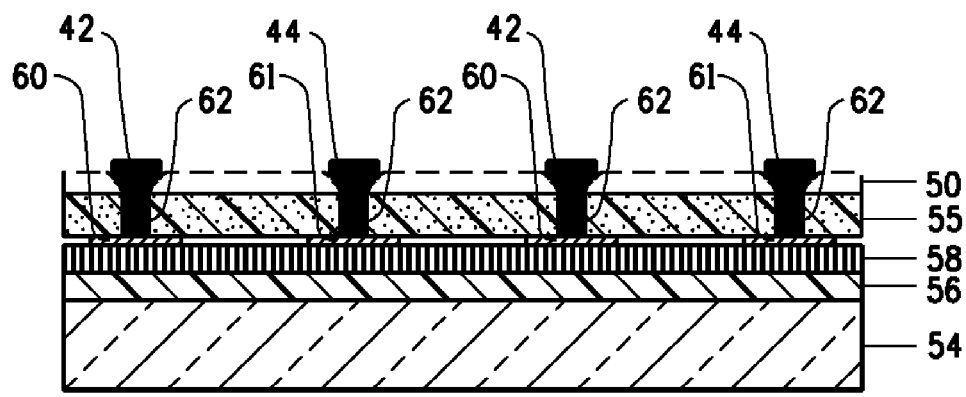

As shown in FIG. 6d, heating pins 65 of a welding apparatus 64 are arranged to be applied to the conductive wires. The heating pins 65 may be in a spring loaded "bed of nails" arrangement so as to be able to contact numerous points on the conductive wires at the same time. The pins 65 heat the portions of the wire over the back contacts and can press the wires into engagement with the balls 62 of solder or adhesive polymer. When the wires are soldered to the back contacts, the pins 65 heat the portions of the wires over the back contacts of the solar cell to a temperature in the range of about 150° C. to 700° C., and more typically 400° C. to 600° C. Solders that melt at lower temperatures, such as about 160° C., are useful in the disclosed process. FIG. 6e shows the wires 42 and 44 once they have been electrically connected to the back contacts 60 and 61, respectively.

Figure 6F:
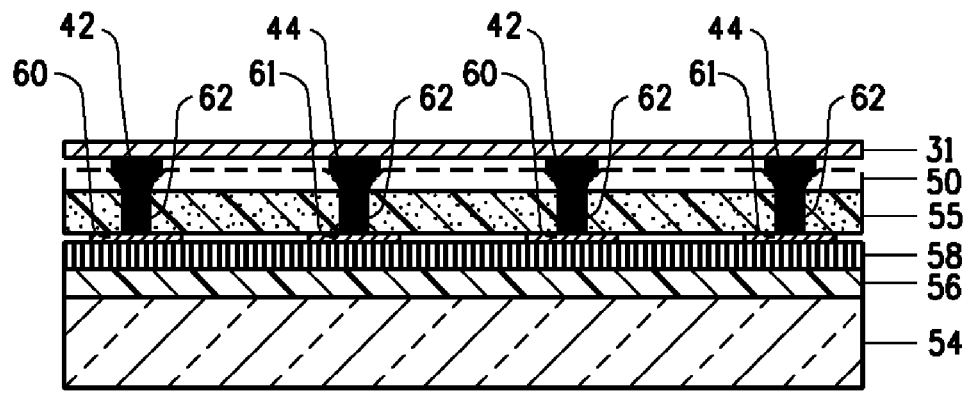

As shown in FIG. 6f, a back-sheet 31 is applied over the wire mounting layer. The back-sheet 31 may comprise one or more polymer layers, a glass sheet or other organic or inorganic substrates conventionally used as back-sheets for photovoltaic modules. Where the back-sheet is polymeric, the back-sheet may have an outer layer and multiple inner layers where the outer layer is made of a durable, weather resistant and electrically insulating polymeric material. The back-sheet layers may be comprised of polymeric material, optionally in conjunction with other materials. The polymeric layers may comprise a polymer film, sheet or laminate. The polymeric layers may, for example, be comprised of film comprised of one or more of polyester, fluoropolymer, polycarbonate, polypropylene, polyethylene, cyclic polyloefin, acrylate polymer such as polymethylmethacrylate (PMMA), polystyrene, styrene-acrylate copolymer, acrylonitrile-styrene copolymer, poly(ethylene naphthalate), polyethersulfone, polysulfone, polyamide, epoxy resin, glass fiber reinforced polymer, carbon fiber reinforced polymer, acrylic, cellulose acetate, vinyl chloride, polyvinylidene chloride, vinylidene chloride, and the like. The layers of the back-sheet laminate may be adhered to each other by adhesives between the layers or by adhesives incorporated into one or more of the laminate layers. Laminates of polyester films and fluoropolymer are suitable for the back-sheet layers. Suitable polyesters include polyethylene terephthalate (PET), polytrimethylene terephthalate, polybutylene terephthalate, polyhexamethylene terephthalate, polyethylene phthalate, polytrimethylene phthalate, polybutylene phthalate, polyhexamethylene phthalate or a copolymer or blend of two or more of the above. Suitable fluoropolymers include polyvinylfluoride (PVF), polyvinylidene fluoride, polychlorotrifluoroethylene, polytetrafluoroethylene, ethylene-tetrafluoroethylene and combinations thereof.

Adhesive layers may comprise any conventional adhesives known in the art. Polyurathane, epoxy, and ethylene copolymer adhesives may, for example, be used to adhere the polymer film layers of the backsheet. There are no specific restrictions to the thickness of the adhesive layer(s) as long as the adhesion strength and durability can meet the back-sheet performance requirements. In one embodiment, the thickness of the adhesive layer is in the range of 1-30 microns, preferably 5-25 microns, and more preferably 8-18 microns. There are no specific restrictions on the thickness of the back-sheet or on the various polymer film layers of the back-sheet. Thickness varies according to specific application. In one preferred embodiment, the polymeric substrate comprises a PVF outer exposed layer with a thickness in the range of 20-50 μm adhered to a PET film with a thickness of 50-300 μm using an extruded ethylene copolymer thermoplastic adhesive.

Various known additives, fillers or reinforcing agents may be added to the polymer layer(s) of the back-sheet to satisfy various different requirements. Suitable additives may include, for example, light stabilizers, UV stabilizers, thermal stabilizers, anti-hydrolytic agents, light reflection agents, pigments, titanium dioxide, dyes, slip agents, glass fibers and the like.

The polymeric films of the back-sheet may include one or more non-polymeric layers or coatings such as a metallic, metal oxide or non-metal oxide surface coating. Such non-polymeric layers or coatings are helpful for reducing moisture vapor transmission through a back-sheet structure. The thickness of a preferred metal oxide layer or non-metal oxide layer on one or more of the polymer films typically measures between 50 Å and 4000 Å, and more typically between 100 Å and 1000 Å.

Figure 6G:
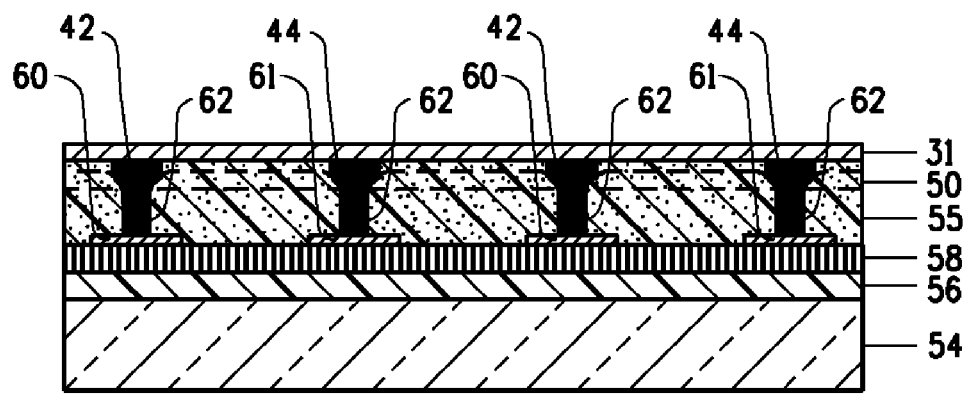

An additional layer of encapsulant material or an adhesive material, as described above, may be inserted between the wire mounting layer 50 and the back sheet 31 to improve adhesion between the back-sheet 31 and the wire mounting layer 50. After the back-sheet 31 is placed over the wire mounting layer 50, the entire stack is subjected to heat lamination, as for example in a heated vacuum press. The lamination process causes a encapsulant layer 55 to melt and penetrate the openings, holes or open mesh of the wire mounting layer and fill in any open space between the wire mounting layer and the back sheet 31. When the encapsulant solidifies, it adheres the back of the solar cell 58 and to the back-sheet 31 and it helps to hold the wire mounting layer 50 in place as shown in FIG. 6g. The stiffness and high melting temperature of the porous wire mounting layer 50, as well as the bonding of the wires to the back contacts of the solar cells serves to keep the conductive wires in place.

When a conductive adhesive is used to attach and electrically connect the conductive wires to the back contacts of the solar cells, the conductive adhesive may be heated above its softening temperature with the heated pins 65 as described above with regard to soldering and FIG. 6d. More preferably, the heated pin contact step can be eliminated and the conductive adhesive can be selected to have a softening temperature close to the temperature that must be applied to module during lamination so as to melt and cure the encapsulant and cause the adhesive polymer to electrically connect and bond the solar cell back contacts and the conductive wires during the thermal lamination of the solar module. In this alternative embodiment, where the conductive adhesive 62 is softened during lamination, it is not necessary to heat the wires and balls 62 prior to the lamination step. The stiff wire mounting layer serves to hold the conductive wires 42 and 44 in place during lamination of the solar module.

Figure 7A:
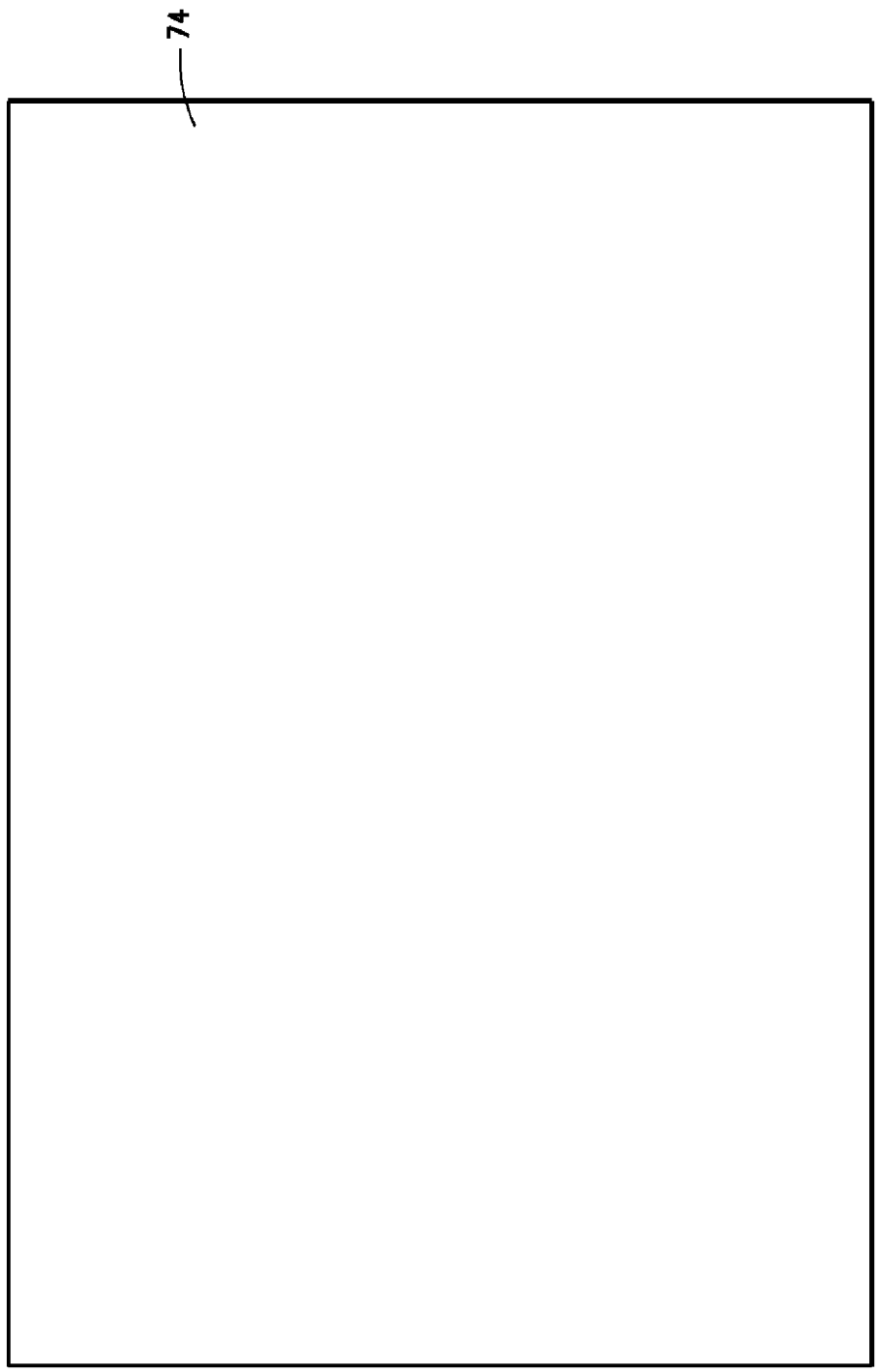
FIGS. 7a-7f illustrate steps of a process for forming a back-contact solar cell module in which an array of back-contact solar cells are electrically connected in series by conductive wires that are integrated into the solar cell module.
Figure 7B:
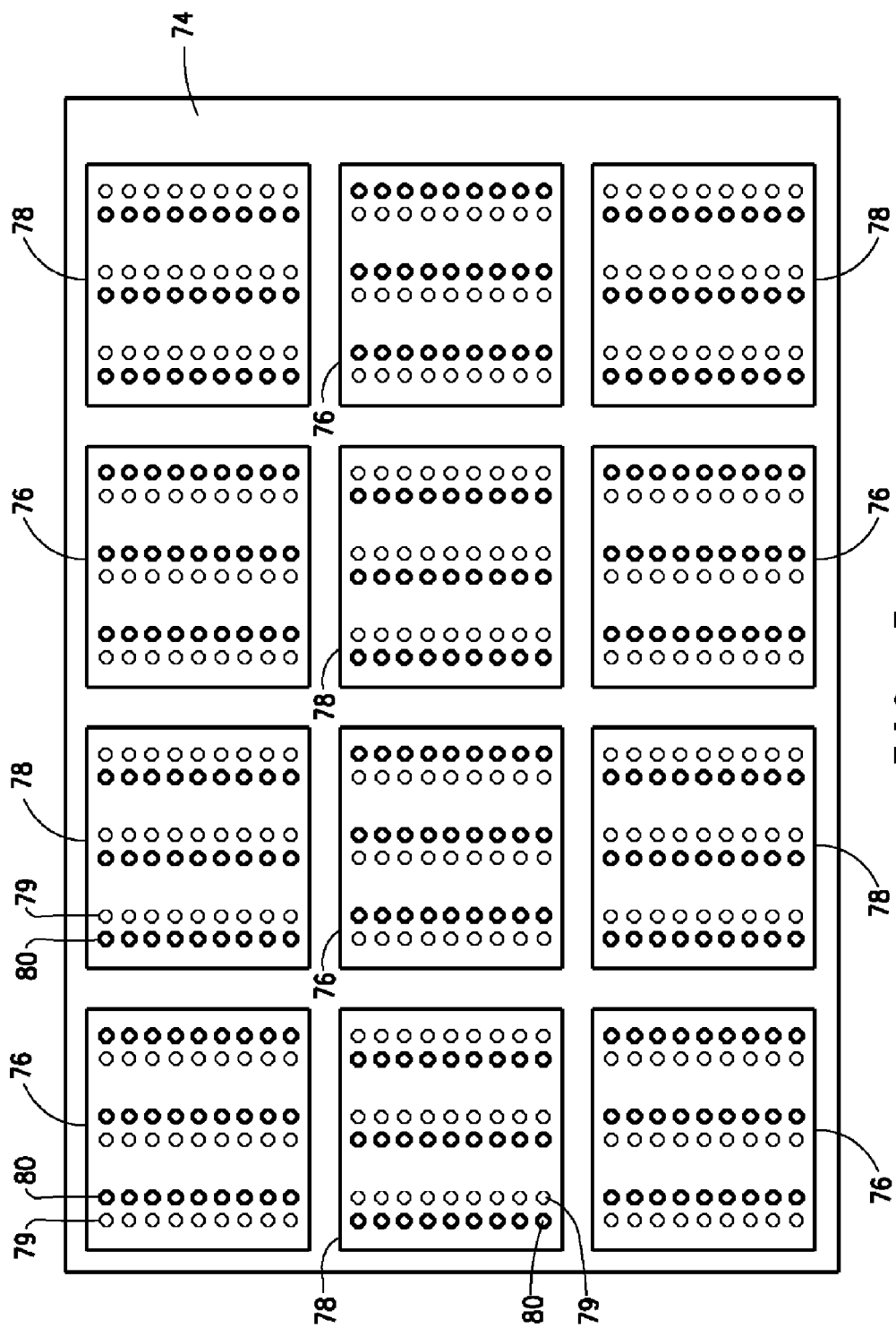

A process for forming a back contact solar cell module with solar cells connected in series by the disclosed wire mounting structure is shown in FIGS. 7a-7f. According to this process, a front encapsulant layer 74 is provided as shown in FIG. 7a. The front encapsulant layer may be comprised of one of the encapsulant or adhesive sheet materials described above with regard to the encapsulant layer 55. The front encapsulant layer must readily transmit light. The front encapsulant layer may be an independent self supporting sheet that can be adhered on its front side to a transparent front sheet (not shown) such as a glass or polymer front sheet, or it may be a sheet, coating or layer already adhered on a transparent front sheet. As shown in FIG. 7b, an array of back contact solar cells 76 and 78 are placed on the surface of the encapsulant layer 74 opposite to the front sheet side of the encapsulant layer. The solar cells 76 and 78 are placed with their front light receiving sides facing against the front encapsulant layer 74.

Each of the solar cells has columns of positive and negative polarity back contacts with the negative contacts represented by the lighter circles 79 and the positive contacts represented by darker circles 80 in FIG. 7b. In the cells 76, in each pair of back contacts, a positive contact 80 is to the right of a negative contact 79. The cells 78 are rotated 180 degrees such that in each pair of back contacts, a negative contact 79 is to the right of one of the positive contacts 80. The cells 76 alternate with the cells 78 in both the vertical and horizontal directions of the solar cell array. It is contemplated that in other embodiments, there could be more of the positive or more of the negative contacts on the solar cells, or that there could be more or fewer columns of either the positive or negative back contacts. While FIG. 7b shows a cell 76 in the upper left hand corner of the solar cell array, it is contemplated that the cells could be arranged with a cell 78 in the upper left hand corner and with a cells 76 arranged below and next to the upper left hand corner cell 78. While the solar cell placements 76 and 78 are shown as alternating in both the vertical and horizontal directions of the array, it is also contemplated that in an array of series connected solar cells, the cell placements 76 and 78 could be alternated only in the vertical direction.

Figure 7C:
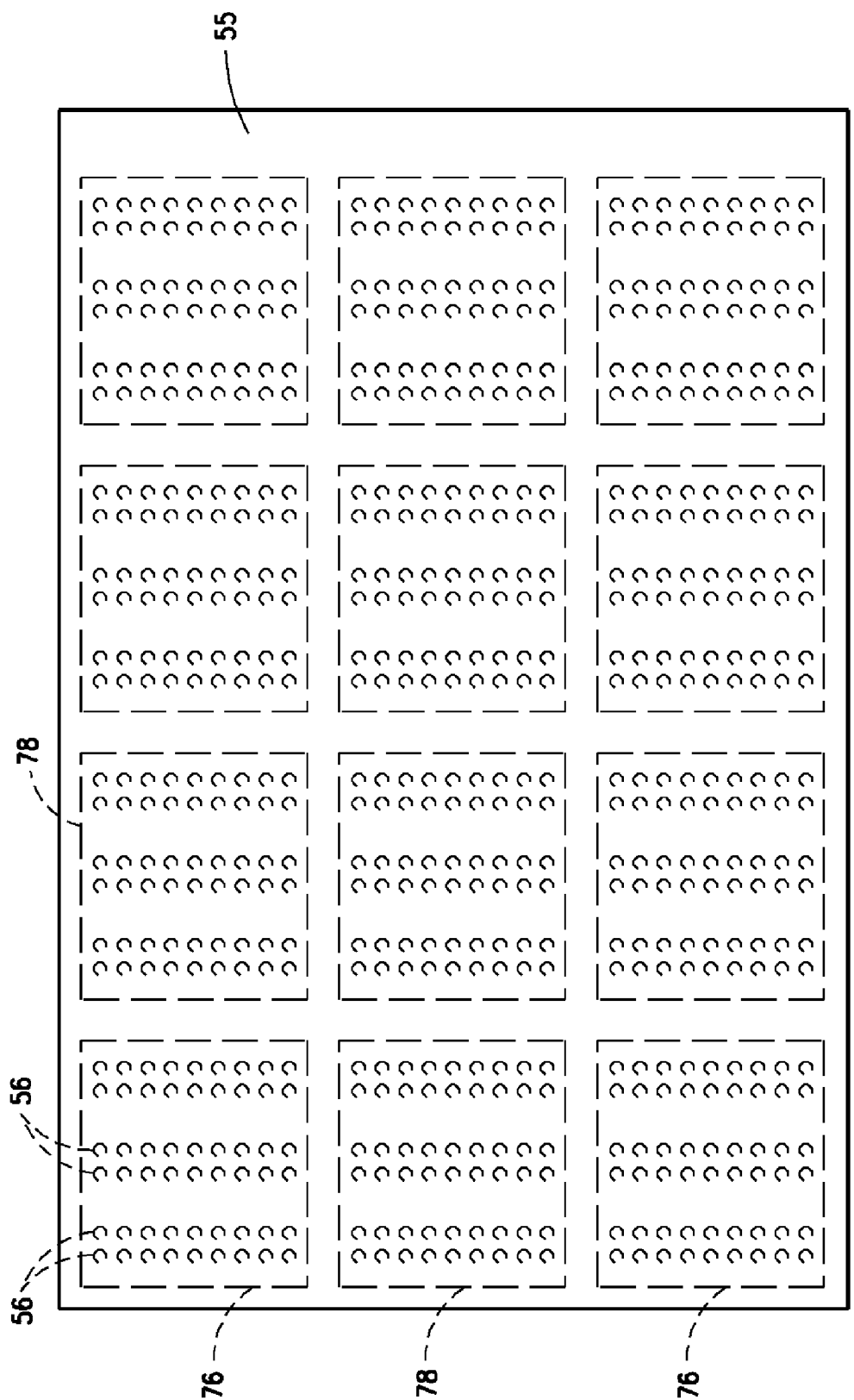
Figure 7D:
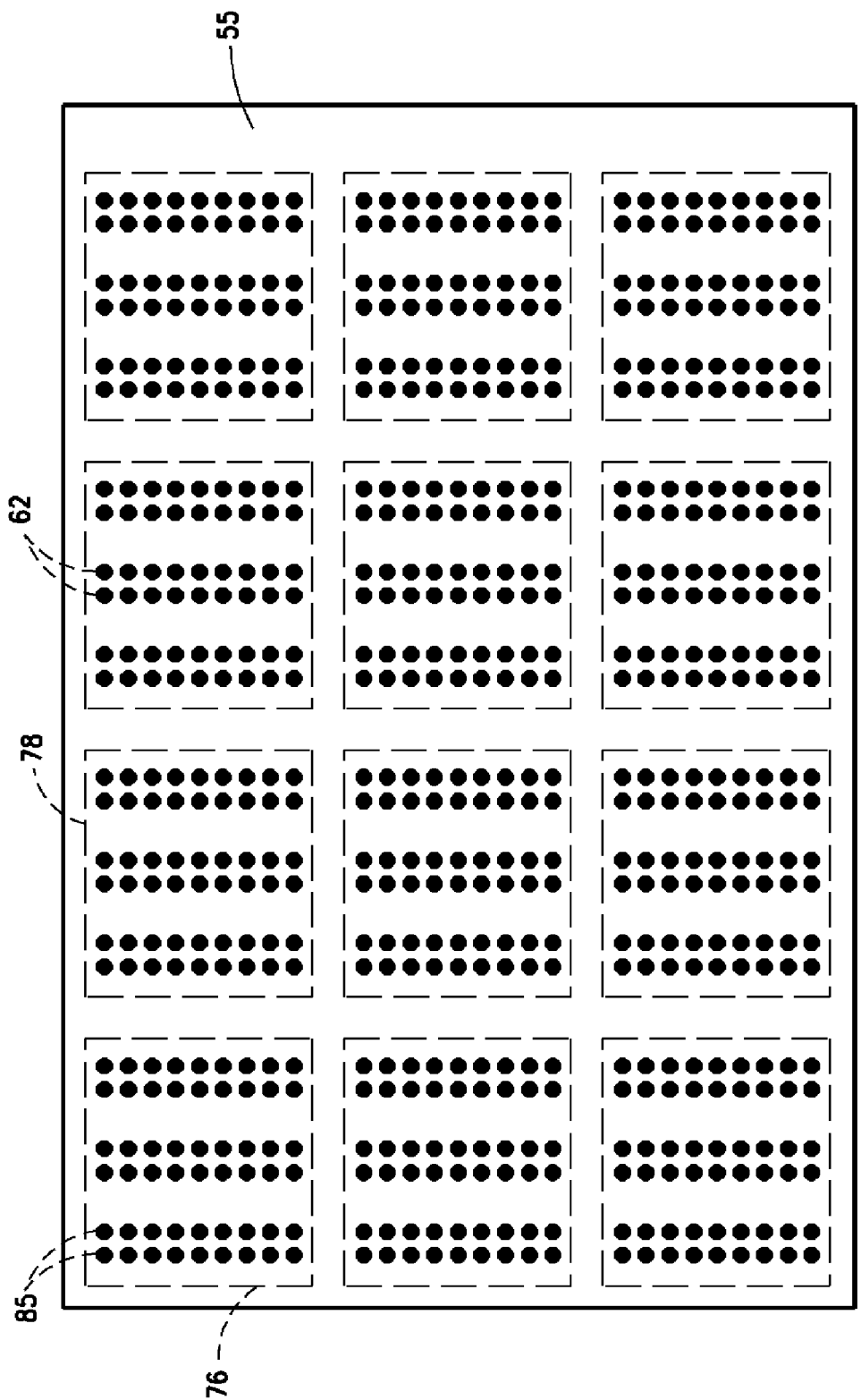

In FIG. 7c, an encapsulant layer 55 is placed over the back of the solar cell array. Holes 56 are preformed, cut or punched in the encapsulant layer 55 over where the back contacts of the solar cell array will be located. In FIG. 7d, the holes or openings in the encapsulant layer 55 are shown filled with conductive adhesive dabs or balls 62 which may be screen printed in the holes 56 of the encapsulant layer 55, or alternatively may be applied by syringe or other application method.

Figure 7E:
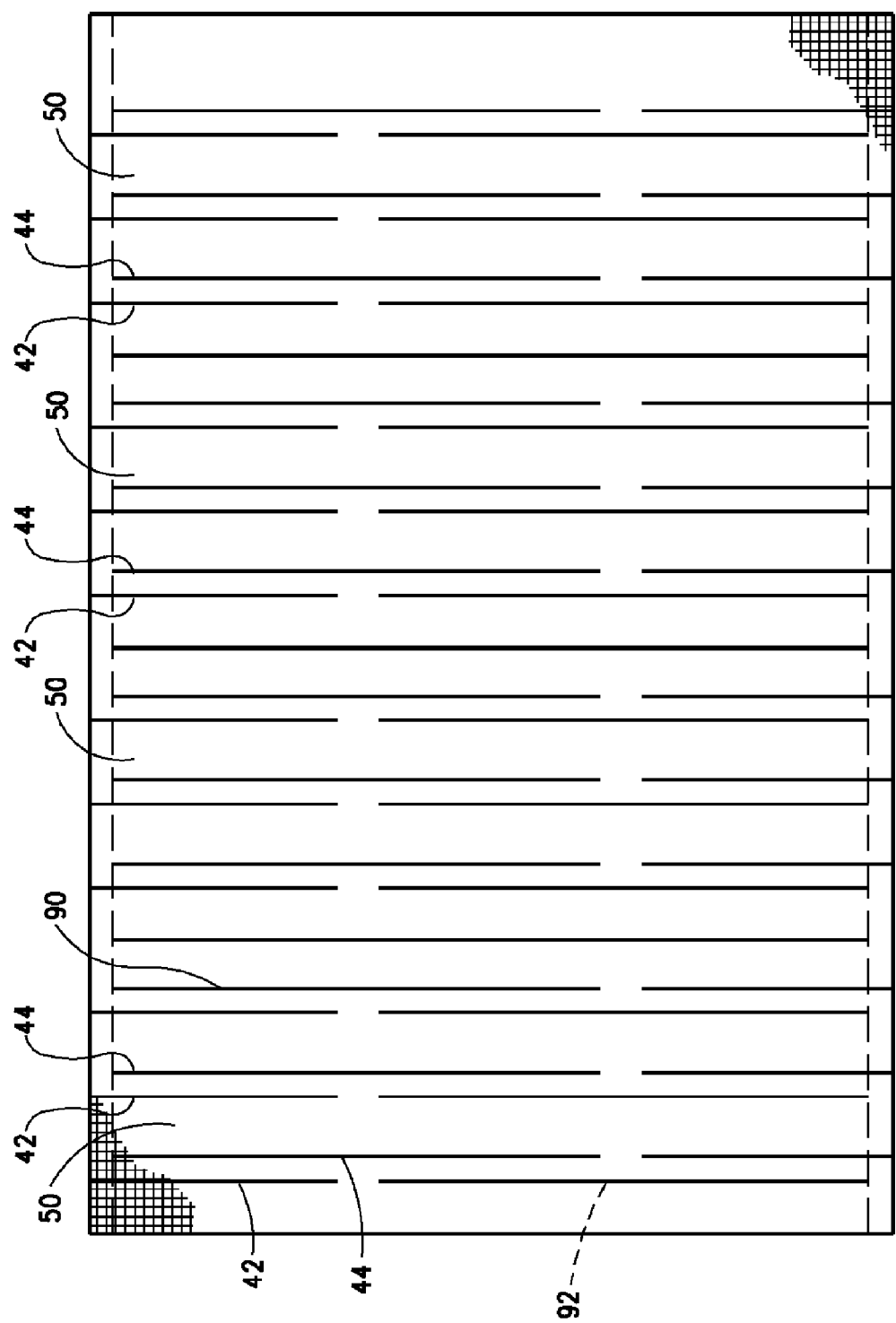

In FIG. 7e, one or more porous wire mounting layer strips 50 with longitudinally extending wires 42 and 44, like the wire substructure shown and described with regard to FIG. 4b, are provided and applied over the encapsulant layer 55. The wires 42 and 44 are provided over sets of positive and negative back contacts on the solar cells. The wires are positioned so that the conductive wires 42 and 44 can contact the conductive adhesive dabs 62 shown in FIG. 7d in the holes of the encapsulant layer 55 through the openings in the porous wire mounting layer mesh. In one embodiment, the side of the wire mounting layer strips on which the wires are mounted is already adhered to a protective back-sheet. It is contemplated that all of the conductive wires 42 and 44 required for a module could be adhered to a single wire mounting layer strip that covers the entire solar cell array of a solar module.

Figure 7F:
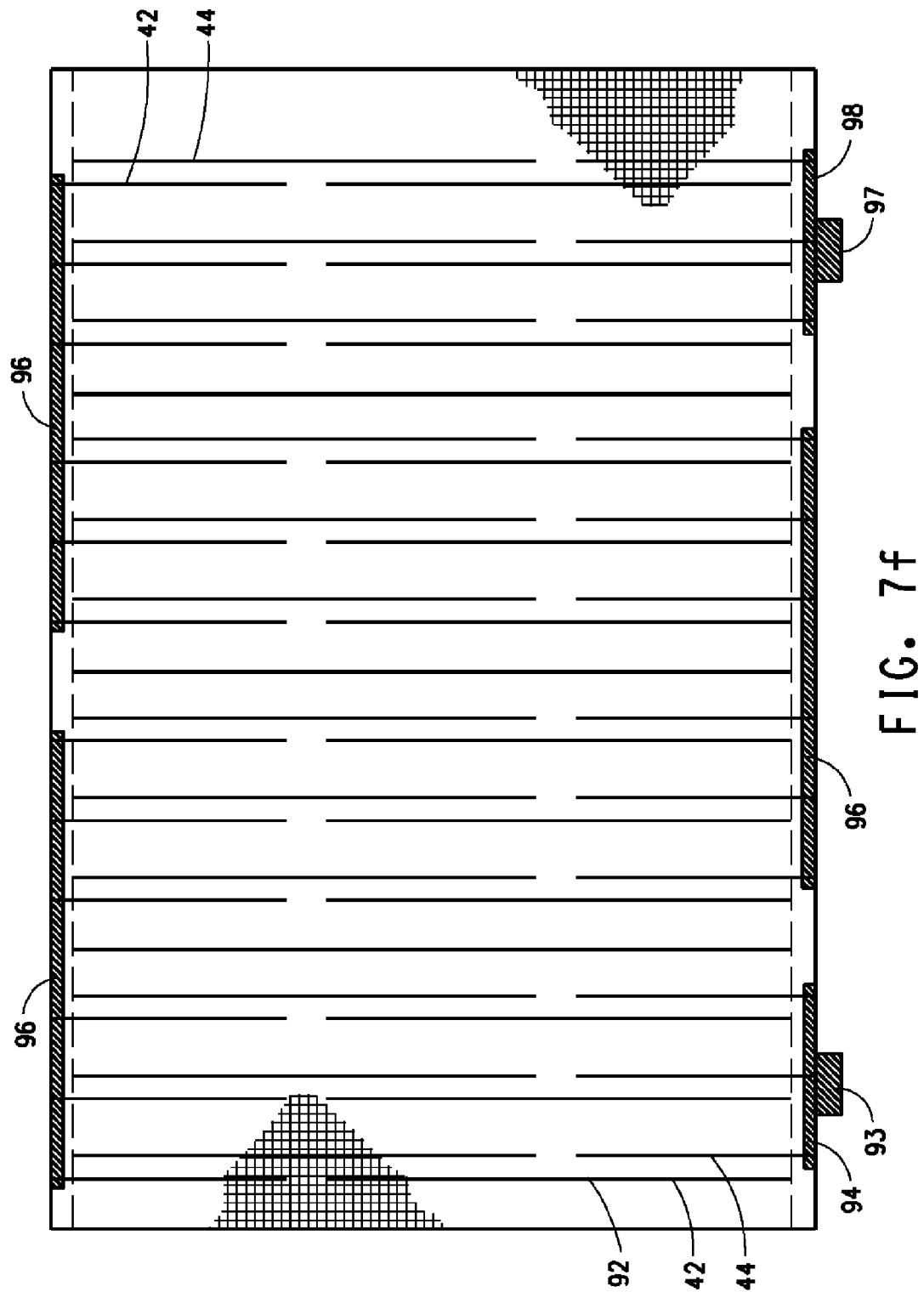

As shown in FIGS. 7e and 7f, one of the wires 42 and 44 have been selectively cut between each set of solar cells in a column of solar cells in the solar cell array. The wires may be cut by mechanical die cutting, rotary die cutting, mechanical drilling or laser ablation. Cutting of the wires may also be performed by punching a hole through both the wire and the wire mounting layer, which hole will be filled during module lamination by polymer flowing from the encapsulant layer between the wire mounting layer and the solar cells. As shown in FIG. 7e, the wires 42 are positioned over columns of the solar cell back-contacts 79 of negative polarity that can be seen in FIG. 7b, and the wires 44 are positioned over the columns of back-contacts 80 of positive polarity of the solar cell 76 shown in FIG. 7b in the upper left corner of the solar cell array. The wires 42 are cut between where the wires 42 contact the solar cell 76 and where they contact the solar cell 78 which has been rotated 180 degrees and that is positioned below the cell 76. The wires 44 which positioned over the positive polarity contacts on the upper left solar cell 76 runs continuously over the negative contacts on the solar cell 78 positioned below the upper left solar cell 76 so as to connect the positive polarity contacts of the one cell in series to the negative polarity contacts of the next cell. The wires 44 are cut between where the wires 44 are positioned over the cell 78 and where they are positioned over the next cell 76 at the bottom right side of the solar cell array that can be seen in FIG. 7b. On the other hand, the wires 42 that are positioned over the positive contacts of the middle cell in the left hand column of the solar cell array run continuously to where the wires 42 are positioned over the negative contacts of the solar cell 76 at the bottom right side of the solar cell array as can be seen in FIG. 7b. This pattern is repeated for as many solar cells as there are in the columns of the solar cell array. In FIG. 7e, the wires 42 and 44 are shown as being attached to four wire mounting layer strips 50, but it is contemplated that the wires could all be mounted, and optionally precut, on just one or two wire mounting layer strips that cover the entire solar cell array.

FIG. 7f shows the application of bus connections 94, 96, and 98 on the ends of the solar module. The terminal buss 94 connects to the wires 44 that are over and will connect to the positive back-contacts on the solar cell at the bottom left hand side of the solar cell array. Likewise, the terminal buss 98 connects to the wires 44 that are over the negative back-contacts on the solar cell at the bottom right hand side of the solar cell array. Positive terminal buss 94 is connected to a positive lead 93 and the negative terminal buss 98 is connected to a negative lead 97. The intermediate buss connectors 96 connect the positive or negative back contacts at the top or bottom of one column of solar cells to the oppositely charged contacts at the same end of the adjoining column of solar cells. The terminal buss connections may alternately be extended in the "Z" direction out through the back-sheet. This would eliminate the need for extra space at the ends of the module for running the buss wires to the junction box. Such "extra space" would reduce the packing density of the cells and reduce the electric power output per unit area of the module.

The solar cell array shown in FIG. 7 is simplified for purpose of illustration and shows only four columns of three solar cells, and each solar cell is shown with just three columns of positive and three columns of negative back contacts. It is contemplated that the solar cell array of the solar module could have many more columns or rows of individual solar cells, and that each solar cell could have fewer or more columns or rows of back contacts than what is shown in FIG. 7.

The photovoltaic module of FIG. 7 may be laminated through autoclave and non-autoclave processes. For example, the photovoltaic module constructs described above may be laid up in a vacuum lamination press and laminated together under vacuum with heat and standard atmospheric or elevated pressure. In an exemplary process, a glass sheet, a front-sheet encapsulant layer, a back-contact photovoltaic cell layer, a back-sheet encapsulant layer, a layer of longitudinally extending wires on a porous wire mounting layer, and a back-sheet as disclosed above are laminated together under heat and pressure and a vacuum (for example, in the range of about 27-28 inches (689-711 mm) Hg) to remove air. In an exemplary procedure, the laminate assembly is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of from 50 to 250 psig, and preferably about 200 psi (about 14.3 bars), for from about 10 to about 50 minutes. Preferably the bag is autoclaved at a temperature of from about 120° C. to about 160° C. for 20 minutes to about 45 minutes. More preferably the bag is autoclaved at a temperature of from about 135° C. to about 160° C. for about 20 minutes to about 40 minutes.

Air trapped within the laminate assembly may be removed using a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly is passed through a set of nip rolls so that the air in the void spaces between the photovoltaic module outside layers, the photovoltaic cell layer and the encapsulant layers may be squeezed out, and the edge of the assembly sealed. This process may provide a final photovoltaic module laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and the pressure is raised to between about 50 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the photovoltaic module laminates are removed from the autoclave. The described process should not be considered limiting. Essentially, any lamination process known within the art may be used to produce the back contact photovoltaic modules with integrated back conductive circuitry as disclosed herein.

If desired, the edges of the photovoltaic module may be sealed to reduce moisture and air intrusion by any means known within the art. Such moisture and air intrusion may degrade the efficiency and lifetime of the photovoltaic module. Edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

While the presently disclosed invention has been illustrated and described with reference to preferred embodiments thereof, it will be appreciated by those skilled in the art that various changes and modifications can be made without departing from the scope of the present invention as defined in the appended claims.

What is claimed is:

1. A process for making a back-contact solar cell module, comprising:
    providing a solar cell array of at least four solar cells each having a front light receiving surface, an active layer that generates an electric current when said front light receiving surface is exposed to light, and a rear surface opposite said front surface, said rear surface having positive and negative polarity electrical contacts thereon, at least two of the solar cells of the solar cell array arranged in a column;
    providing a porous wire mounting layer having opposite first and second sides and having a lengthwise direction and a crosswise direction perpendicular to the lengthwise direction, said porous wire mounting layer being porous throughout;
    providing a plurality of elongated electrically conductive wires and adhering said plurality of electrically conductive wires to the first side of said porous wire mounting layer in the lengthwise direction of said porous wire mounting layer, said plurality of electrically conductive wires not touching each other upon being adhered to said porous wire mounting layer, and said plurality of electrically conductive wires extending at least the length of at least two of the solar cells in the solar cell array;
    providing a polymeric encapsulant layer between the rear surface of the solar cells and the second side of the porous wire mounting layer, said polymeric encapsulant layer having openings formed therein that are aligned with electrical contacts of the rear surface of the solar cells;
    providing a conductive material in the openings of polymeric encapsulant layer, and physically and electrically connecting said positive and negative polarity electrical contacts on the rear surface of said solar cells to the electrically conductive wires on the porous wire mounting layer by said conductive material through said encapsulant layer and said porous wire mounting layer;
    melting the polymeric encapsulant layer, forcing some of said melted encapsulant into the porous wire mounting layer, and solidifying said polymeric encapsulant so as to adhere the encapsulant to the rear surface of the solar cells and to the wire mounting layer; and
    providing a back-sheet, and adhering the back-sheet over the plurality of electrically conductive wires and over the first side of said polymeric wire mounting layer.

2. The process for making a back-contact solar cell module of claim 1 wherein said porous wire mounting layer is a glass fiber mesh.

3. The process for making a back-contact solar cell module of claim 1 wherein said porous wire mounting layer is a porous layer comprised of polymeric material having a melting temperature that is higher than the melting temperature of the polymeric encapsulant layer.

4. The process for making a back-contact solar cell module of claim 3 wherein said porous wire mounting layer is a porous mesh or weave comprised of polymeric fibers.

5. The process for making a back-contact solar cell module of claim 3 wherein said porous wire mounting layer is comprised of a cross-linked ethylene vinyl acetate polymer.

6. The process for making a back-contact solar cell module of claim 3 wherein said porous wire mounting layer is comprised of a cured polymer.

7. The process for making a back-contact solar cell module of claim 3 wherein said encapsulant layer is comprised of poly(vinyl butyral), ionomers, ethylene vinyl acetate, poly(vinyl acetal), polyurethane, poly(vinyl chloride), polyolefin, polyolefin block elastomers, ethylene acrylate ester copolymers, ethylene copolymers, silicone elastomers, chlorosulfonated polyethylene, and combinations thereof.

8. The process for making a back-contact solar cell module of claim 1 wherein the melted encapsulant passes through the porous wire mounting layer and adheres to the back-sheet when the encapsulant solidifies.

9. The process of claim 1 wherein the conductive material in the openings of the poloymeric encapsulant layer passes through open pores in the porous wire mounting layer to electrically and physically connect to the electrically conductive wires adhered to the first side of the wire mounting layer.

10. The process of claim 1 wherein columns of openings are formed in the wire mounting layer and such openings are aligned with the openings in the encapsulant layer, and the electrically conductive wires adhered to the first side of the wire mounting layer are each positioned over a column of holes in the wire mounting layer.

11. The process for making a back-contact solar cell module of claim 1 wherein the conductive material in the openings of the poloymeric encapsulant layer passes is selected from solder and conductive adhesive.

* * * * *